United States Patent
Chen et al.

(10) Patent No.: US 11,296,519 B2
(45) Date of Patent: Apr. 5, 2022

(54) TERMINAL DEVICE, BATTERY SYSTEM, AND DEVICE FOR DETECTING BATTERY ABNORMALITY

(71) Applicant: GUANGDONG OPPO MOBILE TELECOMMUNICATIONS CORP., LTD., Guangdong (CN)

(72) Inventors: Wei Chen, Guangdong (CN); Zhihua Hu, Guangdong (CN); Jun Zhang, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 150 days.

(21) Appl. No.: 16/355,188

(22) Filed: Mar. 15, 2019

(65) Prior Publication Data

US 2019/0212395 A1 Jul. 11, 2019

Related U.S. Application Data

(63) Continuation of application No. PCT/CN2017/099126, filed on Aug. 25, 2017.

(51) Int. Cl.
*G01R 31/3842* (2019.01)
*G01R 31/36* (2020.01)
(Continued)

(52) U.S. Cl.
CPC ........ *H02J 7/0029* (2013.01); *G01R 31/3646* (2019.01); *G01R 31/3842* (2019.01);
(Continued)

(58) Field of Classification Search
None
See application file for complete search history.

(56) References Cited

U.S. PATENT DOCUMENTS 8,655,535 B2 * 2/2014 Oh ............................ B60L 3/04
701/22
9,099,871 B2 * 8/2015 White ................... H02J 7/0014
(Continued)

FOREIGN PATENT DOCUMENTS

CN  1665098 A  9/2005
CN  101425678 A  5/2009
(Continued)

OTHER PUBLICATIONS

Communication pursuant to Article 94(3) EPC issued in corresponding European application No. 17922552.9 dated May 7, 2020.
(Continued)

*Primary Examiner* — Jermele M Hollington
(74) *Attorney, Agent, or Firm* — Young Basile Hanlon & MacFarlane, P.C.

(57) ABSTRACT

A device for detecting battery abnormality, a battery system, and a terminal device are provided. The device includes a voltage-sudden-change detecting circuit, a current detecting circuit, and an abnormality detecting unit. The voltage-sudden-change detecting circuit is configured to detect whether a sudden change in voltage has occurred to a battery and output a sudden-change signal when the sudden change in voltage has occurred. The current detecting circuit is configured to detect a consumption current of the battery and output a small-current signal when the consumption current of the battery is smaller than a preset current threshold. The abnormality detecting unit is coupled with the voltage-sudden-change detecting circuit and the current detecting circuit, and configured to determine that the battery is abnormal upon reception of the sudden-change signal and the small-current signal, store state information on battery abnormality, and send the state information to a controller of a terminal device.

20 Claims, 5 Drawing Sheets

(51) Int. Cl.
*H01M 10/0525* (2010.01)
*H01M 10/48* (2006.01)
*H02J 7/00* (2006.01)

(52) U.S. Cl.
CPC ..... *H01M 10/0525* (2013.01); *H01M 10/486* (2013.01); *H02J 7/0031* (2013.01); *H02J 7/0047* (2013.01); *H02J 7/0021* (2013.01)

(56) References Cited

U.S. PATENT DOCUMENTS

| | | | |
|---|---|---|---|
| 11,163,008 B2* | 11/2021 | Chen | G01R 19/16542 |
| 11,171,496 B2* | 11/2021 | Chen | H01M 10/425 |
| 2009/0088993 A1* | 4/2009 | Oohasi | B60L 50/40 |
| | | | 702/63 |
| 2009/0108808 A1 | 4/2009 | He et al. | |
| 2009/0128157 A1* | 5/2009 | Moriya | G01R 31/3842 |
| | | | 324/426 |
| 2010/0188050 A1 | 7/2010 | Asakura et al. | |
| 2014/0300366 A1* | 10/2014 | Kobayakawa | H02J 7/0047 |
| | | | 324/433 |
| 2015/0153416 A1* | 6/2015 | Umemura | H01M 10/443 |
| | | | 320/107 |
| 2016/0054389 A1 | 2/2016 | Koba et al. | |
| 2017/0082693 A1 | 3/2017 | Leidich et al. | |
| 2020/0099216 A1* | 3/2020 | Chen | H02J 7/0031 |
| 2021/0088590 A1* | 3/2021 | Takahashi | G01R 19/16542 |

FOREIGN PATENT DOCUMENTS

| | | |
|---|---|---|
| CN | 101470173 A | 7/2009 |
| CN | 101714647 A | 5/2010 |
| CN | 101790691 A | 7/2010 |
| CN | 102403551 A | 4/2012 |
| CN | 202651843 U | 1/2013 |
| CN | 104518477 A | 4/2015 |
| EP | 2403105 A2 | 1/2012 |
| JP | H04197100 A | 7/1992 |
| JP | 2008305752 A | 12/2008 |
| JP | 2009186235 A | 8/2009 |
| JP | 2010025594 A | 2/2010 |
| JP | 2010093953 A | 4/2010 |
| JP | 5313616 B2 | 10/2013 |
| JP | 2014112093 A | 6/2014 |
| JP | 2017032351 A | 2/2017 |
| KR | 101674636 B1 | 11/2016 |
| WO | 2011148592 A1 | 12/2011 |

OTHER PUBLICATIONS

English translation of Examination Report issued in corresponding IN application No. 201917027267 dated Jun. 19, 2020.
Extended European search report issued in corresponding European application No. 17922552.9 dated Aug. 28, 2019.
Notice of Reasons Refusal with English Translation for issued in corresponding JP application No. 2019-569774 dated Jan. 5, 2021.
Korean Office Action with English Translation for KR Application 10-2019-7037786 dated Apr. 21, 2021. (22 pages).
Extended European Search Report for EP Application 21182337.2 dated Sep. 16, 2021. (10 pages).
Korean Grant of Patent with English Translation for KR Application 1020197037786 dated Oct. 27, 2021. (4 pages).
Relan et al., "A Local Polynomial Approach to Nonparametric Estimation of the Best Linear Approximation of Lithium-Ion Battery from Multiple Datasets", IEEE Control Systems Letters vol. 1 No. 1, Jul. 2017, pp. 182-187.
Chinese First Office Action with English Translation for CN Application 201780047509.3 dated Dec. 20, 2021. (16 pages).
Ming Ding et al., "Summary of Battery Energy Storage System in Renewable Energy Power Generation", Automation of Electric Power Systems, vol. 37 No. 1, Jan. 10, 2013, 9 pages.

* cited by examiner

TERMINAL DEVICE, BATTERY SYSTEM, AND DEVICE FOR DETECTING BATTERY ABNORMALITY

CROSS-REFERENCE TO RELATED APPLICATION(S)

This application is a continuation of International Application No. PCT/CN2017/099126, filed Aug. 25, 2017, the disclosure of which is hereby incorporated by reference in its entirety.

TECHNICAL FIELD

This disclosure relates to the technical field of terminal devices, and particularly to a device for detecting battery abnormality, a battery system, and a terminal device with the battery system.

BACKGROUND

A battery is a source of power for a terminal device such as a mobile phone and provides long-term steady power supply for the terminal device. The battery that was first used for the terminal device is a Nickel chromium battery or a Nickel-metal hydride (Ni-MH) battery. However, as a screen of the terminal device is getting larger, the terminal device is getting more powerful, etc., capacities of the Nickel chromium battery and the Ni-MH battery are already unable to satisfy requirements on power. Instead, a Lithium-ion battery has a great number of advantages. For example, due to its high energy density, the Lithium-ion battery can be made lighter and of higher capacity, charges and discharges faster, and has no memory effect compared with the Nickel chromium battery and the Ni-MH battery. In addition, the Lithium-ion battery causes the least harm to elements in the environment. Therefore, the Lithium-ion battery has gradually replaced the conventional Nickel chromium battery and the conventional Ni-MH battery.

Although the Lithium-ion battery has effectively solved the problem of battery capacity, a problem of safety still exists. For example, when the Lithium-ion battery is damaged and thus leads to a short circuit, heat is produced inside a cell. When the heat is produced too fast, the battery will probably burst into fire and explosion. Therefore, safety monitor needs to be conducted on the battery to avoid accidents.

SUMMARY

According to a first aspect of the present disclosure, a device for detecting battery abnormality is provided. The device for detecting battery abnormality includes a voltage-sudden-change detecting circuit, a current detecting circuit, and abnormality detecting unit. The voltage-sudden-change detecting circuit is configured to detect whether a sudden change in voltage has occurred to a battery and output a sudden-change signal when the sudden change in voltage has occurred. The current detecting circuit is configured to detect a consumption current of the battery and output a small-current signal when the consumption current of the battery is smaller than a preset current threshold. The abnormality detecting unit is coupled with the voltage-sudden-change detecting circuit and the current detecting circuit, and configured to determine that the battery is abnormal upon reception of the sudden-change signal and the small-current signal, store state information on battery abnormality, and send the state information to a controller of a terminal device.

According to a second aspect of the present disclosure, a battery system is provided. The battery system includes a battery, a voltage-sudden-change detecting circuit, a current detecting circuit, and abnormality detecting unit. The voltage-sudden-change detecting circuit is configured to detect whether a sudden change in voltage has occurred to the battery and output a sudden-change signal when the sudden change in voltage has occurred. The current detecting circuit is configured to detect a consumption current of the battery and output a small-current signal when the consumption current of the battery is smaller than a preset current threshold. The abnormality detecting unit is coupled with the voltage-sudden-change detecting circuit and the current detecting circuit, and configured to determine that the battery is abnormal upon reception of the sudden-change signal and the small-current signal.

According to a third aspect of the present disclosure, a terminal device is provided. The terminal includes a battery, a controller, a voltage-sudden-change detecting circuit, a current detecting circuit, and abnormality detecting unit. The voltage-sudden-change detecting circuit is configured to detect whether a sudden change in voltage has occurred to the battery and output a sudden-change signal when the sudden change in voltage has occurred. The current detecting circuit is configured to detect a consumption current of the battery and output a small-current signal when the consumption current of the battery is smaller than a preset current threshold. The abnormality detecting unit is coupled with the voltage-sudden-change detecting circuit and the current detecting circuit, and configured to determine that the battery is abnormal upon reception of the sudden-change signal and the small-current signal, and send identity information of the battery and state information indicating battery abnormality to the controller. The controller is configured to mark the battery as abnormal according to the identity information and the state information.

DETAILED DESCRIPTION

Figure 1:
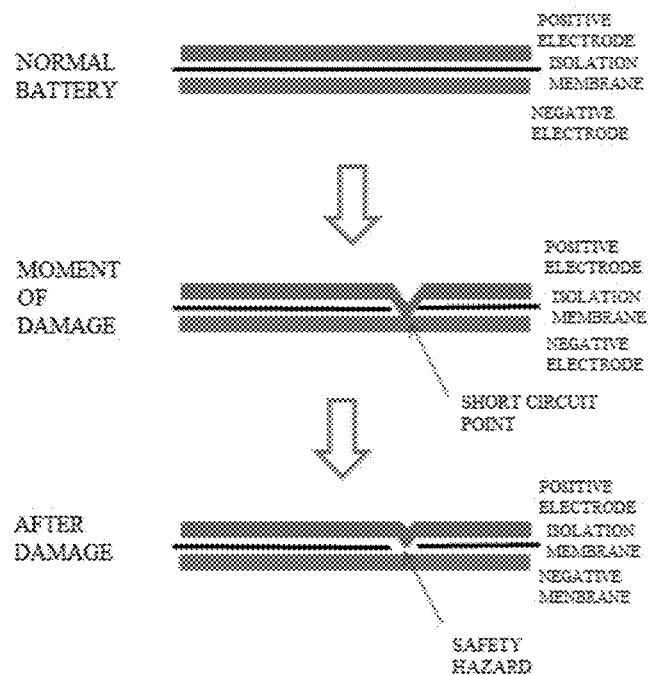
FIG. 1 is a schematic diagram illustrating a process of battery damage according to an implementation of the present disclosure.

Implementations of the present disclosure will be further described below with reference to the accompanying drawings, where the same or similar reference numerals denote the same or similar elements or elements with the same or similar functions. It will be appreciated that the implementations described hereinafter with reference to the accompanying drawings are illustrative and for the purpose of explanation rather than restriction of the disclosure.

Before the device for detecting battery abnormality, the battery system, and the terminal device with the battery system of implementations of the present disclosure are described, a structure of a battery used for terminal devices and safety hazard of the battery will be first described below.

For instance, a Lithium-ion battery mainly includes a cell and a battery protection system. The cell is known as the "heart" of the Lithium-ion battery and includes anode materials and cathode materials, electrolyte, an isolation membrane, and a housing, and outside the cell is the battery protection system. The anode materials of the cell are Lithium molecular materials such as Lithium Manganate, Lithium Cobaltate, and the like. The anode materials determine energy of the battery. The cathode material is graphite. The isolation membrane is disposed between the anode and the cathode of the battery. To make it easier to understand, the isolation membrane is like a piece of paper which is continuously folded within a small battery case and filled with the anode and cathode materials and the electrolyte. In a charging process, Lithium molecules in the anode material are activated and driven, under the action of an external electric field, to the cathode to be stored in gaps of a graphic electrode structure. Driving more Lithium molecules results in more energy stored. In a discharging process, Lithium ions in the cathode are driven to the anode and become initial Lithium molecules in the anode. The above steps are repeated to achieve charging and discharging of the battery.

The isolation membrane is mainly configured to isolate completely the anode materials from the cathode materials of the cell. Once the anode materials and the cathode materials are in direct contact, a short circuit will occur inside the battery, thereby leading to some safety hazard. Therefore, the isolation membrane cannot be too thin since a thin isolation membrane tends to be damaged. However, with more requirements on the terminal device of users, such as a lighter and thinner terminal device, a larger screen, and longer battery life, manufacturers start to look for a battery with higher energy density. For example, increase energy density of the battery by filling in more anode materials and more cathode materials. Nevertheless, for the same volume, more anode materials and cathode materials filled in result in thinner isolation membrane. Since the isolation membrane tends to be damaged when the battery has been subject to damage such as an external impact, the short circuit will probably occur.

As an implementation, when the battery is subject to an external mechanical damage such as squeezing, dropping, and piercing, due to thin isolation membrane, a short circuit between the anode and the cathode (that is, an internal short-circuit within the battery) tends to occur due to damage of isolation membrane. At the moment of the short circuit, a voltage of the battery will be suddenly decreased due to a local internal short-circuit point formed inside the battery. A higher degree to which the battery is damaged leads to more serious voltage decrease.

In general, as to a relatively more serious damage, an area of the internal short-circuit of the battery is larger, and heating will continuously occur at a point of damage until the voltage of the battery decreases to 0V (volt). If the voltage of the battery is high, the battery will even burst into fire and burn. As to a minor damage, the area of the internal short-circuit of the battery is small, and a short-circuit current is formed at a short-circuit point. Since the short-circuit current is large, a large quantity of heat is produced at the short-circuit point and thus fuses the short-circuit point. Therefore, the voltage of the battery will return to an initial state. In this case, the battery may still be used as usual like a normal battery. However, safety hazard already exists in the battery, and the internal short-circuit may be triggered at any time when the battery is in use subsequently. As illustrated in FIG. 1, when the battery is subject to an external mechanical damage, only a minor damage will occur mostly. The internal short-circuit caused as such lasts only a short time, and the battery will soon return to the initial state. However, the isolation membrane is partially damaged at this time. Therefore, such battery abnormality is generally difficult to monitor, while the battery abnormality as such will bring about some safety hazard to the terminal device.

As another implementation, in a charging and discharging process of the battery, Lithium ion may accumulate in the anode and the cathode. When accumulation occurs, a type of dendrite, like crystal formed by many substances, is formed and can gradually become longer. In this process, the dendrite may also pierce the isolation membrane, thereby resulting in the internal short-circuit. The situation described in the above implementation, where the battery is restored to the initial state after a short-term internal short-circuit caused by the external mechanical damage, is even more serious in this case, that is, the internal short-circuit of the battery is easier to happen again.

Once there is short circuit, when the battery is in use, large quantities of heat will be produced inside the cell. The heat can result in vaporization of the electrolyte inside the cell. When the heat is produced too fast, the vaporization process will be very fast accordingly, which will cause increase in internal pressure of the cell. When the internal pressure reaches up to a certain extent to which the housing is unable to bear, the housing can crack, thereby resulting in explosion. When exposed to open fire, the battery can burst into fire.

In addition, besides increasingly thinner isolation membrane caused by increasing energy density, which results in damage of isolation membrane, thereby causing accidents, quick charging is also one of major factors of safety hazard of the battery.

Quick charging, as the name suggests, is a process of charging fast a rechargeable battery. For example, a charging process of the battery can include at least one of a trickle charging stage, a constant-current charging stage, and a constant-voltage charging stage. In the trickle charging stage, a current feedback loop can be utilized to make current flowing into the battery in the trickle charging stage satisfy expected charging current of the battery (such as a first charging current). Exemplarily, when voltage is lower than 3.0V, a 100 mA (milliampere) charging current is adopted to pre-charge the battery. In the constant-current charging stage, a current feedback loop can be utilized to make current flowing into the battery in the constant-current charging stage satisfy expected charging current of the battery (such as a second charging current, which may be larger than the first charging current). Exemplarily, the charging current can range from 0.1 C (Coulomb) to several Coulombs for different batteries, where C represents battery capacity. Generally, in the constant-current charging stage, a 0.1 C charging current is adopted for charging in a normal charging mode. However, in a quick charging mode, a charging current larger than 0.1 C is adopted for charging in the constant-current charging stage to complete charging within a short time period. In the constant-voltage charging stage, a voltage feedback loop can be utilized to make voltage applied to the battery in the constant-voltage charging stage satisfy expected charging voltage of the battery. Exemplarily, when the voltage of the battery is equal to 4.2V, proceed to the constant-voltage charging stage, where charging voltage is constantly 4.2V. When the battery is gradually fully charged, the charging current can be decreased. When the charging current is smaller than 100 mA, it can be determined that the battery is fully charged.

In the constant-current charging stage, since the charging current is large (such as 0.2 C~0.8 C, or even up to 1 C) and the charging process of the battery is an electrochemical reaction process, heat is certainly produced in this process. In addition, larger charging current leads to larger quantities of heat produced within a short time period. When the isolation membrane has been damaged, it may in turn cause the short circuit between the anode and cathode. Once short circuit occurs, more heat tends to be produced, and vaporization of the electrolyte occurs, which can cause increase in internal pressure of the cell. When the internal pressure reaches up to a certain extent to which the housing is unable to bear, the housing can crack, thereby resulting in explosion. When in contact with open fire, the battery can burst into fire.

In other words, once there is internal short-circuit in the battery, the battery is abnormal and thus some safety hazard exists, which may result in accidents when the battery is in use.

Inventors of the present disclosure, based on continuous research and experiments on batteries, find that when the battery is used in a normal state, the voltage of the battery is relatively steady. However, when the battery is damaged, due to probability of the internal short-circuit of the battery, there will be a sudden drop (that is, decrease) in the voltage of the battery in this case, and a signal representing sudden change in voltage is strong. Inventors have verified the existence of sudden change in voltage through a great number of experiments. Therefore, according to test results, once the battery has been damaged, the signal representing sudden change in voltage will exist.

Based on the above findings and a great number of experimental tests, in order to monitor effectively whether the battery has been damaged to avoid safety hazard of the battery, thereby avoiding accidents, the present disclosure detects whether the battery is abnormal effectively, for the purpose of battery protection.

The following will describe the device for detecting battery abnormality, the battery system, and the terminal device according to implementations of the present disclosure with reference to the accompanying drawings.

It should be noted that, in implementations of the present disclosure, the "terminal device" can include but is not limited to a device configured via a wired line and/or a wireless interface to receive/transmit communication signals. Examples of the wired line may include, but are not limited to, at least one of a public switched telephone network (PSTN), a digital subscriber line (DSL), a digital cable, a direct connection cable, and/or another data connection line or network connection line. Examples of the wireless interface may include, but are not limited to, a wireless interface with a cellular network, a wireless local area network (WLAN), a digital television network (such as a digital video broadcasting-handheld (DVB-H) network), a satellite network, an AM-FM broadcast transmitter, and/or with another communication terminal. A communication terminal configured to communicate via a wireless interface may be called a "wireless communication terminal", a "wireless terminal", and/or a "mobile terminal". Examples of a mobile terminal may include, but are not limited to, a satellite or cellular telephone, a personal communication system (PCS) terminal capable of cellular radio telephone, data processing, fax, and/or data communication, a personal digital assistant (PDA) equipped with radio telephone, pager, Internet/Intranet access, web browsing, notebook, calendar, and/or global positioning system (GPS) receiver, and/or other electronic devices equipped with radio telephone capability such as a conventional laptop or a handheld receiver.

Figure 2:
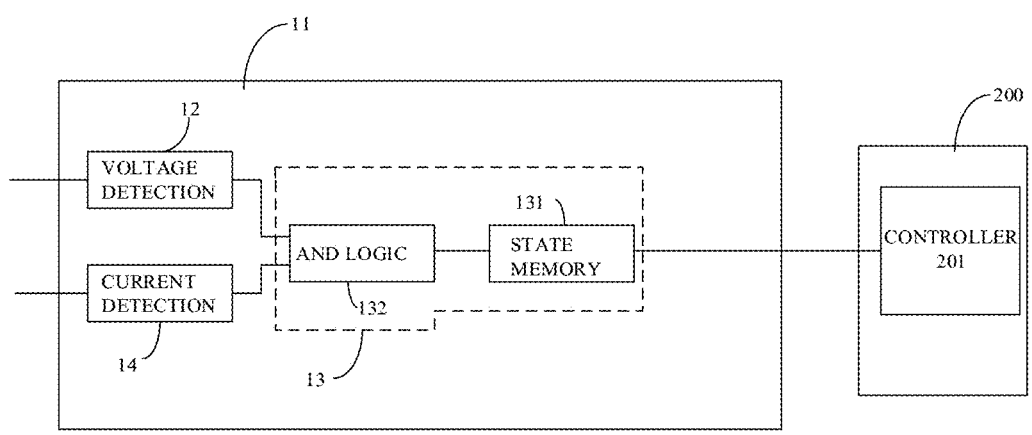
FIG. 2 is a block diagram illustrating a device for detecting battery abnormality according to an implementation of the present disclosure.

FIG. 2 is a schematic block diagram illustrating a device for detecting battery abnormality according to an implementation of the present disclosure. As illustrated in FIG. 2, the device 11 for detecting battery abnormality includes a voltage-sudden-change detecting circuit 12, an abnormality detecting unit 13, and a current detecting circuit 14.

The voltage-sudden-change detecting circuit 12 is configured to detect whether a sudden change in voltage (also known as "voltage jump" for example) has occurred to a battery and output a sudden-change signal to the abnormality detecting unit 13 when the sudden change in voltage has occurred, for example, the voltage of the battery drops by more than 10 mV instantly. The current detecting circuit 14 is configured to detect a consumption current of the battery and output a small-current signal to the abnormality detecting unit 13 when the consumption current of the battery is smaller than a preset current threshold such as 50 mA. The abnormality detecting unit 13 is coupled with the voltage-sudden-change detecting circuit 12 and the current detecting circuit 14 and configured to determine that the battery is abnormal upon reception of the sudden-change signal and the small-current signal. The abnormality detecting unit 13 may be further configured to store state information on battery abnormality (hereinafter, "state information" for short), and send the state information to a controller 201 of a terminal device 200, whereby the controller 201 of the terminal device 200 executes a corresponding protection-and-control strategy, such as forbidding some functions of the terminal device, controlling the terminal device to send alert information to indicate battery abnormality, disconnecting a power supply circuit of the battery, etc. The abnormality detecting unit 13 can also be configured to protect the battery, such as disconnecting the power supply circuit of the battery, to achieve promptly effective protection of the battery by detecting accurately whether the battery is abnormal due to damage and avoid safety hazard.

That is to say, when the abnormality detecting unit 13 receives the sudden-change signal and the small-current signal at the same time, it indicates that sudden change in voltage has occurred to the battery because of instant drop in the voltage, which is caused by damage of the battery rather than sudden increase in a system load, thereby reducing error in detection and improving accuracy of detection.

Figure 3:
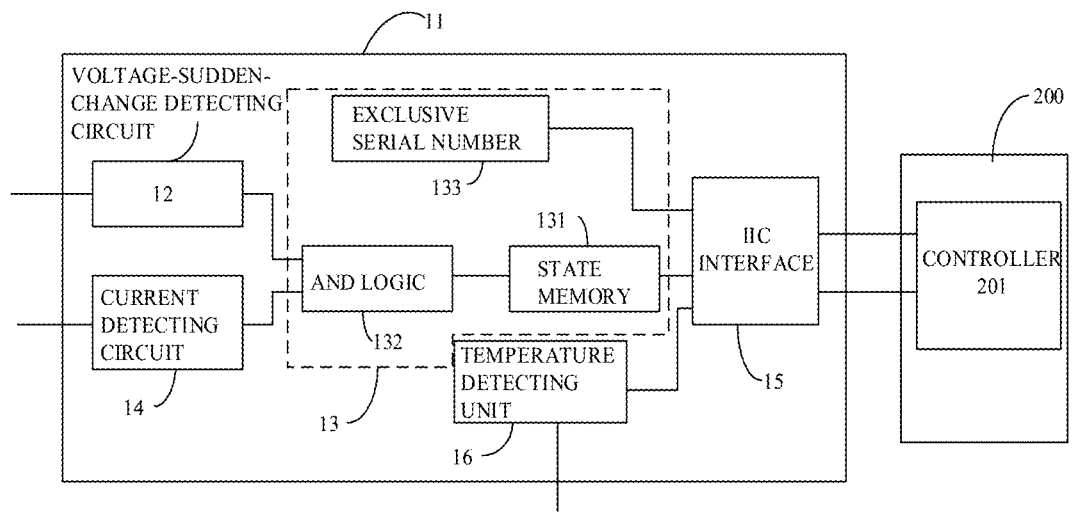
FIG. 3 is a block diagram illustrating a device for detecting battery abnormality according to another implementation of the present disclosure.

In an implementation, as illustrated in FIG. 3, the device 11 for detecting battery abnormality further includes a communication interface 15. The communication interface 15 is coupled with the abnormality detecting unit 13. The abnormality detecting unit 13 is configured to communicate with the controller 201 of the terminal device 200 through the communication interface 15, to send the state information to the controller 201 of the terminal device 200.

Specifically, the communication interface 15 can be an inter-integrated circuit (IIC) interface.

Through the communication interface 15 such as the IIC interface, communication between the device 11 for detecting battery abnormality and the terminal device can be achieved, thereby notifying a user of battery abnormality via the terminal device for prompt alert. In other implementations of the disclosure, the communication interface 15 can also be other types of data interface.

Figure 4:
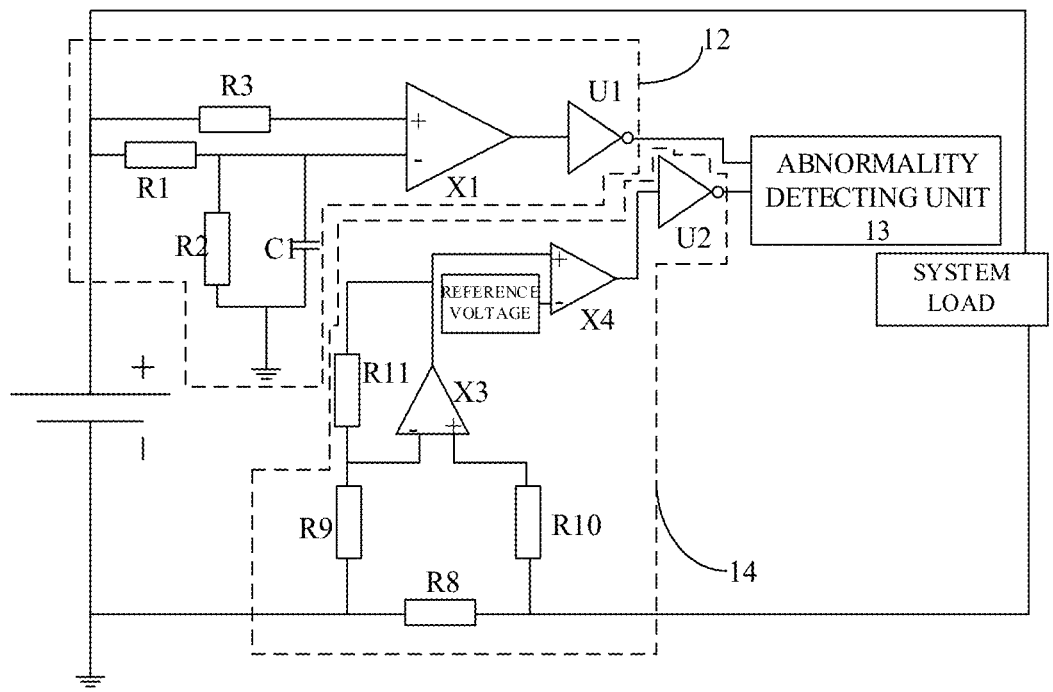
FIG. 4 is a circuit diagram illustrating a device for detecting battery abnormality according to an implementation of the present disclosure.

In implementations of the disclosure, detection of sudden change in voltage can be achieved by a differential amplifying circuit. Specifically, in an implementation, as illustrated in FIG. 4, the voltage-sudden-change detecting circuit 12 includes a first resistor R1, a first capacitor C1, a first differential amplifier X1, a first phase inverter U1, a second resistor R2, and a third resistor R3. The first resistor R1 has one end coupled to a positive electrode of the battery. The first capacitor C1 has one end coupled with the other end of the first resistor R1 at a first node and has the other end grounded. The second resistor R2 is coupled in parallel with the first capacitor C1. The third resistor R3 has one end coupled to the positive electrode of the battery. The first differential amplifier X1 has a negative input end coupled to the first node and a positive input end coupled the third resistor R3, that is, the positive input end of the first differential amplifier X1 is coupled to the positive electrode of the battery via the third resistor R3. The first phase inverter U1 has an input end coupled with an output end of the first differential amplifier X1 and has an output end serving as an output end of the voltage-sudden-change detecting circuit 12.

When the battery is used normally, the voltage of the battery is relatively steady. A voltage of the positive input end of the first differential amplifier X1 and a voltage of the negative input end of the first differential amplifier X1 remain steady, and the voltage of the positive input end of the first differential amplifier X1 is higher than the voltage of the negative input end of the first differential amplifier X1. The first differential amplifier X1 can output continuously a high level, and the first phase inverter U1 outputs a low level accordingly. When the low level is received, the abnormality detecting unit 13 determines that no instant drop in voltage (that is, no sudden change) has occurred to the battery and that the battery is not damaged, that is, the battery is normal. When a sudden change in voltage occurs to the battery, due to existence of the first capacitor C1, the voltage of the negative input end of the first differential amplifier X1 will remain constant in a certain time period, whereas the voltage of the positive input end of the first differential amplifier X1 will suddenly change directly. The first differential amplifier X1 will be reversed and thus output the low level, and the first phase inverter U1 will output the high level accordingly. When the high level is received, the abnormality detecting unit 13 determines that an instant drop has occurred to the voltage of the battery.

In an implementation, as illustrated in FIG. 4, the current detecting circuit 14 includes an eighth resistor R8, a ninth resistor R9, a tenth resistor R10, a third differential amplifier X3, an eleventh resistor R11, a comparator X4, and a second phase inverter U2. The eighth resistor R8 has one end coupled to a negative electrode of the battery and the other end coupled to a positive electrode of the battery via a system load. The eighth resistor R8 is a current detecting resistor. The ninth resistor R9 has one end coupled with said one end of the eighth resistor R8. The tenth resistor R10 has one end coupled with the other end of the eighth resistor R8. The third differential amplifier X3 has a negative input end coupled with the other end of the ninth resistor R9 and has a positive input end coupled with the other end of the tenth resistor R10. The eleventh resistor R11 is coupled between the negative input end of the third differential amplifier X3 and an output end of the third differential amplifier X3. The comparator X4 has a positive input end coupled with the output end of the third differential amplifier X3 and has a negative input end coupled with a reference voltage supply end. The second phase inverter U2 has an input end coupled with an output end of the comparator X4 and has an output end serving as an output end of the current detecting circuit 14.

As illustrated in FIG. 4, the current detecting circuit 14 is configured to detect the consumption current of the battery via the current detecting resistor R8. As such, when the voltage-sudden-change detecting circuit 12 outputs the sudden-change signal, that is, the first phase inverter U1 outputs the high level, in case that the consumption current of the battery flowing through the current detecting resistor R8 is larger than or equal to the preset current threshold, it indicates that the system load increases suddenly, and a voltage of the positive input end of the comparator X4 is higher than a reference voltage of the negative input end of the comparator X4. The comparator X4 outputs the high level accordingly, where the high level is then inverted into a low level by the second phase inverter U2. The abnormality detecting unit 13 receives the high level from the voltage-sudden-change detecting circuit 12 and receives the low level from the current detecting circuit 14 at the same time, and determines that the sudden change in voltage of the battery results from instant drop in the voltage, which is caused by sudden increase in the system load rather than damage of the battery. When the voltage-sudden-change detecting circuit 12 outputs the sudden-change signal, that is, the first phase inverter U1 outputs the high level, in case that the consumption current of the battery flowing through the current detecting resistor R8 is smaller than the preset current threshold, it suggests that no sudden increase in system load has occurred, and the voltage of the positive input end of the comparator X4 is lower than the reference voltage of the negative input end of the comparator X4. The comparator X4 outputs the low level accordingly, where the low level is then inverted into a high level by the second phase inverter U2. The abnormality detecting unit 13 receives the high level from the voltage-sudden-change detecting circuit 12 and receives the high level from the current detecting circuit 14 simultaneously, and determines that the sudden change in voltage of the battery results from instant drop in the voltage, which is caused by damage of the battery rather than sudden increase in the system load, and that the battery is abnormal because of damage.

Therefore, through detection with the voltage-sudden-change detecting circuit 12 and detection with the current detecting circuit 14, error in detection can be reduced and accuracy of determination can be improved.

Figure 5:
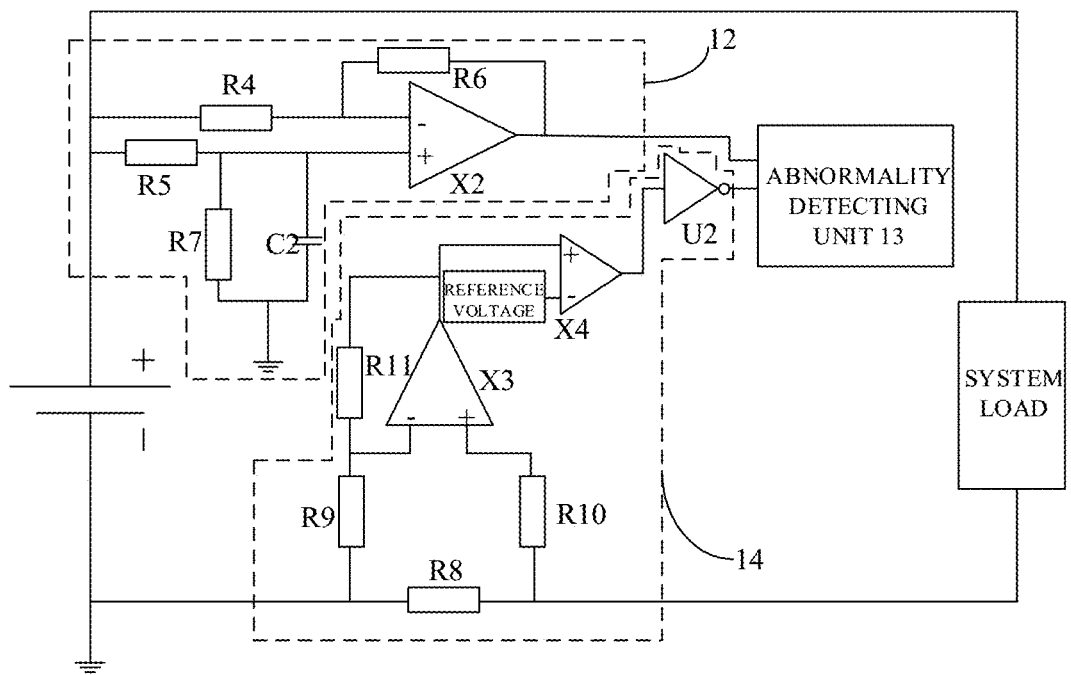
FIG. 5 is a circuit diagram illustrating a device for detecting battery abnormality according to another implementation of the present disclosure.

In another implementation, as illustrated in FIG. 5, the voltage-sudden-change detecting circuit 12 includes a fourth resistor R4, a fifth resistor R5, a second capacitor C2, a second differential amplifier X2, a sixth resistor R6, and a seventh resistor R7. Compared with the structure illustrated in FIG. 4, in FIG. 5, the first phase inverter U1 is omitted and the sixth resistor R6 is introduced.

The components, such as the resistors and capacitors used herein, are referred to by various names depending upon the arrangement of the circuit or device, however, when making and/or using the technical schemes provided herein, corresponding components can be implemented with the same means. For example, the fifth resistor R5 in FIG. 5 and the first resistor R1 in FIG. 4 can be implemented with the same resistor. The same applies to the seventh resistor R7 in FIG. 5 and the second resistor R2 in FIG. 4, as well as the third resistor R4 in FIG. 5 and the third resistor R3 in FIG. 4. Similarly, the first capacitor C1 and the second capacitor C2 can be implemented with the same capacitor.

As illustrated in FIG. 5, the fourth resistor R4 has one end coupled to a positive electrode of the battery. The fifth resistor R5 has one end coupled to the positive electrode of the battery. The second capacitor C2 has one end coupled with the other end of the fifth resistor R5 at a second node and has the other end grounded. The second differential amplifier X2 has a negative input end coupled with the other end of the fourth resistor R4 and has a positive input end coupled to the second node. The second differential amplifier X2 has an output end serving as an output end of the voltage-sudden-change detecting circuit 12. The sixth resistor R6 is coupled between the negative input end of the second differential amplifier X2 and the output end of the second differential amplifier X2. The seventh resistor R7 is coupled in parallel with the second capacitor C2.

In order to expedite the understanding of the disclosure, the first node and the second node mentioned above can be collectively referred to as a "connection node".

When the battery is used normally, the voltage of the battery is relatively steady. A voltage of the positive input end of the second differential amplifier X2 and a voltage of the negative input end of the second differential amplifier X2 remain steady, and the voltage of the positive input end of the second differential amplifier X2 is lower than the voltage of the negative input end of the second differential amplifier X2. The second differential amplifier X2 can output continuously the low level. When the low level is received, the abnormality detecting unit 13 determines that no instant drop has occurred to the voltage of the battery, and that the battery is not damaged, that is, the battery is normal. When a sudden change in voltage has occurred to the battery, due to existence of the second capacitor C2, the voltage of the positive input end of the second differential amplifier X2 will remain unchanged in a certain time period, whereas the voltage of the negative input end of the second differential amplifier X2 will suddenly change directly. The second differential amplifier X2 will be reversed and outputs the high level. When the high level is received, the abnormality detecting unit 13 determines that an instant drop has occurred in the voltage of the battery.

In an implementation, as illustrated in FIG. 4 or FIG. 5, the current detecting circuit 14 includes an eighth resistor R8, a ninth resistor R9, a tenth resistor R10, a third differential amplifier X3, an eleventh resistor R11, a comparator X4, and a second phase inverter U2. The eighth resistor R8 has one end coupled to a negative electrode of the battery and the other end coupled to a positive electrode of the battery via a system load. The eighth resistor R8 is a current detecting resistor. The ninth resistor R9 has one end coupled with said one end of the eighth resistor R8. The tenth resistor R10 has one end coupled with the other end of the eighth resistor R8. The third differential amplifier X3 has a negative input end coupled with the other end of the ninth resistor R9 and has a positive input end coupled with the other end of the tenth resistor R10. The eleventh resistor R11 is coupled between the negative input end of the third differential amplifier X3 and an output end of the third differential amplifier X3. The comparator X4 has a positive input end coupled with the output end of the third differential amplifier X3 and has a negative input end coupled with a reference voltage supply end. The second phase inverter U2 has an input end coupled with an output end of the comparator X4 and has an output end serving as an output end of the current detecting circuit 14.

As illustrated in FIG. 5, the current detecting circuit 14 is configured to detect the consumption current of the battery via the current detecting resistor R8. As such, when the voltage-sudden-change detecting circuit 12 outputs the sudden-change signal, in case that the consumption current of the battery flowing through the current detecting resistor R8 is larger than or equal to the preset current threshold, it indicates that the system load increases suddenly, and a voltage of the positive input end of the comparator X4 is higher than a reference voltage of the negative input end of the comparator X4. The comparator X4 outputs the high level accordingly, where the high level is then inverted to a low level by the second phase inverter U2. When the abnormality detecting unit 13 receives the high level from the voltage-sudden-change detecting circuit 12 and receives the low level from the current detecting circuit 14 at the same time, the abnormality detecting unit 13 determines that the sudden change in voltage of the battery results from instant drop in the voltage, which is caused by sudden increase in the system load rather than caused by damage of the battery. When the voltage-sudden-change detecting circuit 12 outputs the sudden-change signal, in case that the consumption current of the battery flowing through the current detecting resistor R8 is smaller than the preset current threshold, it suggests that no sudden increase in system load has occurred, and the voltage of the positive input end of the comparator X4 is lower than the reference voltage of the negative input end of the comparator X4. The comparator X4 outputs the low level accordingly, where the low level is inverted to a high level by the second phase inverter U2. When the abnormality detecting unit 13 receives the high level from the voltage-sudden-change detecting circuit 12 and receives the high level from the current detecting circuit 14 simultaneously, the abnormality detecting unit 13 determines that the sudden change in voltage of the battery results from instant drop in the voltage, which is caused by damage of the battery rather than sudden increase in the system load, and that the battery is abnormal because of damage.

Therefore, through detection with the voltage-sudden-change detecting circuit 12 and detection with the current detecting circuit 14, error in detection can be reduced and accuracy of determination can be improved.

In one implementation, the abnormality detecting unit 13 is further configured to store identity information of the battery, and send the identity information of the battery to the controller 201 of the terminal device 200 when the state information on battery abnormality is sent to the controller 201 of the terminal device 200, whereby the controller 201 of the terminal device 200 marks the battery as abnormal to distinguish directly an abnormal battery due to damage, thereby facilitating monitor of the abnormal battery.

Specifically, in one implementation, as illustrated in FIG. 3, the abnormality detecting unit 13 includes an AND gate 132, a state memory 131, and an identity information memory 133. The AND gate 132 has a first input end coupled with an output end of the voltage-sudden-change detecting circuit 12 and a second input end coupled with an output end of the current detecting circuit 14. The AND gate is configured to execute an "AND" operation on the sudden-change signal and the small-current signal to determine whether the battery is abnormal. The state memory 131 is coupled with an output end of the AND gate 132, and the state memory 131 is configured to store the state information on battery abnormality when the battery is abnormal and to send the state information to the controller 201 through the communication interface 15. The identity information memory 133 is configured to store identity information of the battery such as an exclusive serial number of the battery.

That is to say, when the AND gate 132 receives the high level from the voltage-sudden-change detecting circuit 12 and receives the high level from the current detecting circuit 14 simultaneously, the AND gate 132 outputs the high level. The state memory 131 is configured to store the state information for indicating that the battery is abnormal due to damage when the state memory 131 receives the high level from the AND gate 132, whereby the controller 201 of the terminal device reads the state information to determine that sudden change in voltage has occurred due to damage of the battery and identify that the battery is abnormal, thereby achieving effective battery protection, avoiding safety hazard, and ensuring safety of the battery in use.

In implementations of the disclosure, the inventor, through a quantity of tests and experiments, has found that when the battery is used normally, the voltage of the battery is relatively steady. However, when the battery is subject to an external mechanical damage such as dropping, colliding, squeezing, piercing, and the like, there will be a sudden change in voltage of the battery. Therefore, in the device for detecting battery abnormality provided herein, whether the battery is damaged at present can be monitored by detecting, with the voltage-sudden-change detecting circuit 12, whether sudden change in voltage has occurred, in combination with detecting, with the current detecting circuit 14, a magnitude of the consumption current of the battery. Once a sudden change in voltage of the battery is detected and the consumption current of the battery is detected to be small, it indicates that the battery is damaged at present, the internal short-circuit has occurred, and the battery is determined to be abnormal with some safety hazard.

Figure 6:
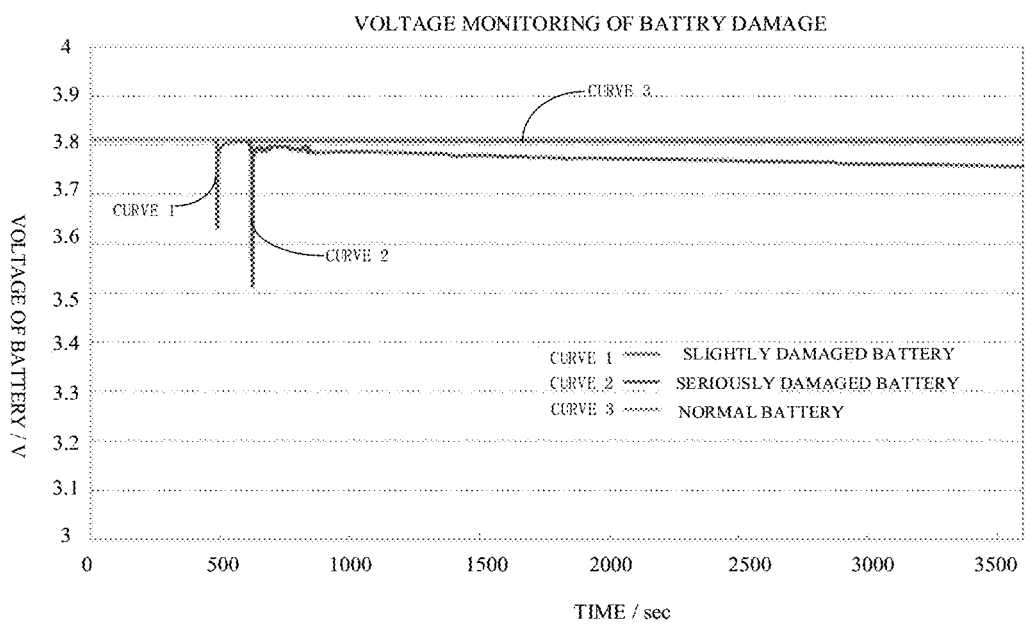
FIG. 6 is a diagram illustrating a voltage monitoring curve of a damaged battery and a voltage monitoring curve of a normal battery according to an implementation of the present disclosure.

In one implementation, voltage monitoring curves in a process in which the battery is subject to damage are illustrated in FIG. 6. Curve 1 is a voltage curve of a slightly damaged battery. Curve 2 is a voltage curve of a seriously damaged battery. Curve 3 a voltage curve of a normal battery that not damaged at all. According to Curve 1, when the battery is slightly damaged, the voltage of the battery changes suddenly from 3.8V to 3.63V in an instant and then is restored to about 3.8V. According to Curve 2, when the battery is seriously damaged, the voltage of the battery changes suddenly from 3.8V to 3.51V in an instant and then is restored to nearly 3.8V. According to Curve 3, for a normal battery, which is not damaged, the voltage of the battery remains nearly 3.8V. Therefore, by comparison of Curve 1, Curve 2, and Curve 3, when the battery is subject to an external mechanical damage such as dropping, colliding, squeezing, piercing, and the like, there will be a sudden change in voltage of the battery, that is, the voltage will drop instantly. In addition, different degrees to which the battery is damaged result in different magnitudes of drops in the voltage.

In an implementation, as illustrated in FIG. 3, the device 11 for detecting battery abnormality further includes a temperature detecting unit 16. The temperature detecting unit 16 is configured to detect temperature of the battery and send the temperature of the battery to the controller 201 of the terminal device 200 through the communication interface 15.

The controller 201 of the terminal device 200 is configured to determine, according to the state information on battery abnormality and the temperature of the battery, a fault grade of the abnormal battery, and restrict corresponding functions of the terminal device according to the fault grade.

Specifically, the controller 201 can be configured to dynamically adjust and determine a threshold of instant drop in voltage according to the temperature of the battery. A different temperature of the battery corresponds to a different threshold. For example, a magnitude of instant drop in voltage under a low temperature is greater than the magnitude of instant drop in voltage under a high temperature. Therefore, based on different temperatures of the battery, instant drop in voltage of the battery due to damage can be diagnosed according to the state information on battery abnormality. For example, information on a magnitude of instant drop in voltage of a damaged battery can be acquired. Since different temperatures of the battery result in different magnitudes of instant drop in voltage when the battery is damaged, an extent to which the battery is damaged can be determined accurately based on the temperature of the battery and the magnitude of instant drop in voltage due to damage of the battery, and then the fault grade is determined according to the extent to which the abnormal battery is damaged. In other words, the more seriously the battery is damaged, the higher the corresponding fault grade is.

Therefore, the device for detecting battery abnormality can be configured to monitor whether the battery is damaged by detecting whether instant drop has occurred. Once instant drop in the voltage of the battery is detected and the consumption current of the battery is detected to be small, it is determined that the battery is damaged and that internal short-circuit has occurred, and accordingly, the battery is determined to be abnormal with some safety hazard. Then the state information is sent to the controller 201 of the terminal device, and the controller 201 acquires the magnitude of instant drop in voltage due to damage of the battery according to the state information, thus diagnosing the extent to which the battery is damaged under different temperatures, determining the fault grade, and restricting corresponding functions according to the fault grade.

In an implementation, the controller 201 of the terminal device 200 is further configured to control the terminal device to send alert information to indicate the battery is abnormal, when the controller 201 of the terminal device 200 receives the state information on battery abnormality. As such, prompt alert and repair can be conducted to avoid safety hazard caused by the abnormal battery, which can substantially improve safety of the terminal device in use.

Figure 7:
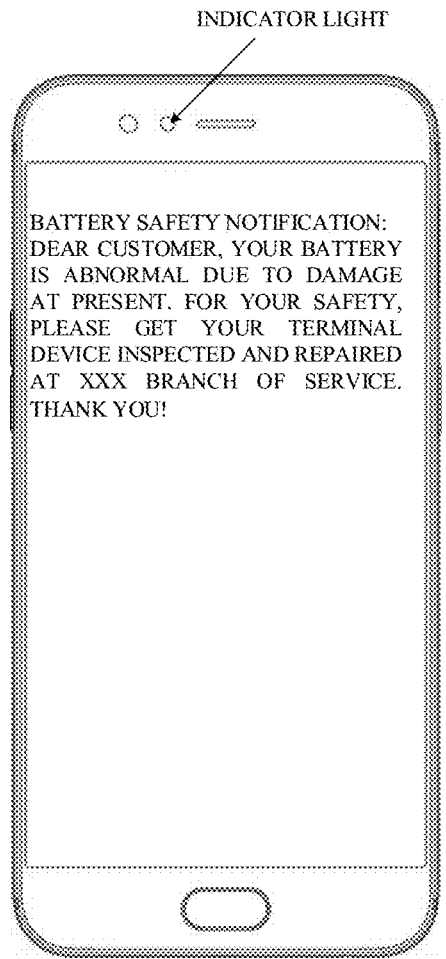
FIG. 7 is a schematic diagram illustrating alert information of a terminal device according to an implementation of the present disclosure.

For instance, when the controller of the terminal device acquires the state information, it is necessary to send alert information to a user. As an implementation, as illustrated in FIG. 7, the user can be reminded by such alert information as "Battery safety notification: dear customer, your battery is abnormal due to damage at present. For your safety, please get your terminal device inspected and repaired at xxx branch of service. Thank you". As another implementation, when the user is reminded through the alert information illustrated in FIG. 7, the user can be further reminded by an indicator light turned on. For example, control the indicator light to be on red at a high frequency. As yet another implementation, the user can be further reminded through a speech function of the terminal device.

In general, when the user receives the above alert information, the user can promptly get the terminal device inspected and repaired. However, some users may fail to realize the seriousness of the problem when they receive the alert information. Therefore, they are likely to ignore the alert information and continue using the terminal device as usual. In this case, the user can be reminded multiple times. For example, the user can be reminded at least three times. When the user still does not deal with the problem after being reminded multiple times, some functions of the terminal device can be restricted.

For instance, generally speaking, lower power consumption of applications of the terminal device leads to lower heating when the battery is in use. Exemplarily, only an instant messaging (IM) application is launched without a video chat. In this case, power consumption is low, heating of the battery is low, and thus risks of the battery are less likely to occur. However, when power consumption of an application(s) is high, such as watching a video, playing a mobile game, etc., power consumption of the battery is high and heating of the battery is high, which can easily cause accidents. Therefore, when the battery is determined to be abnormal, according to different fault grades determined above, forbid use of applications of high power consumption such as video applications, game applications, etc., or forbid directly the entire system to be launched for fear of accidents, and alert information such as "There is battery safety hazard and the system is forbidden to be launched. Please get the terminal device inspected and repaired at xxx branch of service. Thank you for your cooperation" is displayed on a display screen of the terminal device to remind the user. Alternatively, the system is powered off and unable to be launched.

In addition, since heating can also occur in a charging process of the battery, especially in a quick charging state where more heating occurs within a short time, when the battery is determined to be abnormal, quick charging of the battery is also forbidden. In a more serious situation, the user is even forbidden to charge the battery for fear of accidents, and alert information such as "Due to damage of the battery, charging of the battery is forbidden. Please get the terminal device inspected and repaired at xxx branch of service. Thank you for your cooperation" is displayed on the display screen of the terminal device to remind the user.

In implementations of the disclosure, the device for detecting battery abnormality can be integrated into a battery protection chip or a battery fuel gauge.

According to the device for detecting battery abnormality provided herein, the voltage-sudden-change detecting circuit is configured to detect whether sudden change in voltage of the battery has occurred and output the sudden-change signal to the abnormality detecting unit based on a determination that the sudden change in voltage has occurred. The current detecting circuit is configured to detect the consumption current of the battery and output the small-current signal to the abnormality detecting unit when the consumption current of the battery is smaller than a preset current threshold. The abnormality detecting unit is configured to determine the battery is abnormal due to damage upon reception of the sudden-change signal and the small-current signal, store the state information on battery abnormality, and send the state information to the controller of the terminal device, for battery protection and alert for abnormality of the battery, so as to avoid safety hazard resulting from damage of the battery. That is to say, when the battery is damaged, a sudden change in voltage of the battery will occur. Since the system load has not increased suddenly, the consumption current of the battery does not vary substantially in general. Therefore, the device for detecting battery abnormality provided herein determines whether the battery is abnormal due to damage by detecting whether sudden change in voltage of the battery has occurred and detecting the magnitude of the consumption current of the battery, which can avoid safety hazard because of the abnormal battery and improve substantially safety of the terminal device in use.

Figure 8:
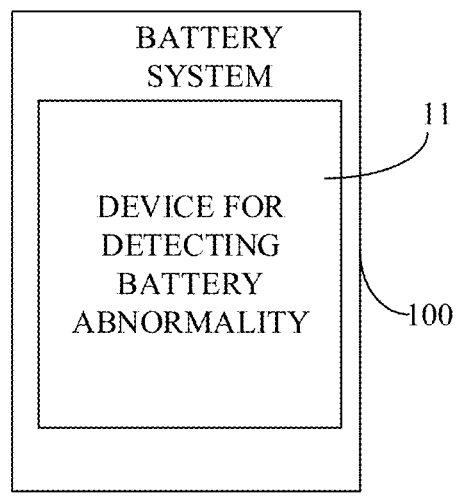
FIG. 8 is a block diagram illustrating a battery system according to an implementation of the present disclosure.

As illustrated in FIG. 8, a battery system 100 is provided in implementations of the disclosure. The battery system 100 includes the device 11 for detecting battery abnormality described above.

According to the battery system provided herein, the device for detecting battery abnormality described above is configured to determine whether a battery is abnormal due to damage by detecting whether a sudden change in voltage of the battery has occurred and detecting a magnitude of a consumption current of the battery, which can avoid safety hazard because of an abnormal battery and improve substantially safety of a terminal device in use.

Figure 9:
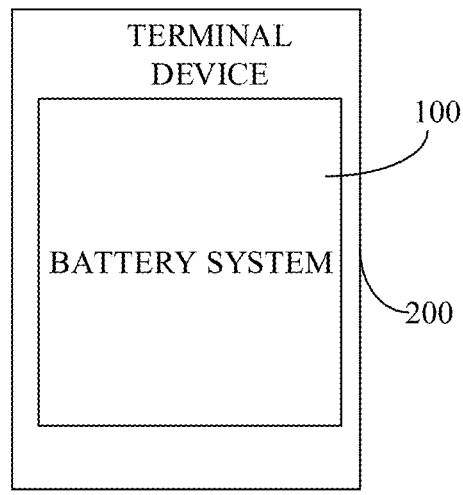
FIG. 9 is a block diagram illustrating a terminal device according to an implementation of the present disclosure.

In addition, as illustrated in FIG. 9, the terminal device 200 is provided in implementations of the disclosure. The terminal device 200 includes the battery system 100 mentioned above.

The terminal device provided herein includes the battery system above with the device for detecting battery abnormality. Whether a battery is abnormal due to damage can be determined by detecting whether a sudden change in voltage of the battery has occurred and detecting a magnitude of a consumption current of the battery, thereby avoiding safety hazard because of an abnormal battery and improving substantially safety of the terminal device in use.

It should be understood that terms such as "center", "longitudinal", "lateral", "length", "width", "thickness", "on", "under", "front", "back", "left", "right", "vertical", "horizontal", "top", "bottom", "in", "out", "clockwise", "anticlockwise", "axial", "radial", "circumferential", and the like referred to herein which indicate directional relationship or positional relationship are directional relationship or positional relationship based on accompanying drawings and are only for the convenience of description and simplicity, rather than explicitly or implicitly indicate that apparatuses or components referred to herein must have a certain direction or be configured or operated in a certain direction and therefore cannot be understood as limitation on the disclosure.

In addition, terms "first", "second", and the like are only used for description and cannot be understood as explicitly or implicitly indicating relative importance or implicitly indicating the number of technical features referred to herein. Therefore, features restricted by terms "first", "second", and the like can explicitly or implicitly include at least one of the features. In the context of the disclosure, unless stated otherwise, "multiple" refers to "at least two", such as two, three, and the like.

Unless stated otherwise, terms "installing", "coupling", "connecting", "fixing", and the like referred to herein should be understood in broader sense. For example, coupling may be a fixed coupling, a removable coupling, or an integrated coupling, may be a mechanical coupling, an electrical coupling, and may be a direct coupling, an indirect coupling through a medium, or a communication coupling between two components or an interaction coupling between two components. For those of ordinary skill in the art, the above terms in the present disclosure can be understood according to specific situations.

Unless stated otherwise, a first feature being "on" or "under" a second feature referred to herein can refer to a direct contact between the first feature and the second feature or an indirect contact between the first feature and the second feature via a medium. In addition, the first feature being "above", "over", and "on" the second feature can be the first feature being right above or obliquely above the second feature or only refers to the first feature being at higher horizontal level than the second feature. The first feature being "below", "underneath", and "under" the second feature can be the first feature being right below or obliquely below the second feature or only refers to the first feature being at lower horizontal level than the second feature.

The reference term "an embodiment", "some embodiments", "implementation", "specific implementation", or "some implementations" referred to herein means that a particular feature, structure, material, or characteristic described in conjunction with the embodiment or implementation may be contained in at least one embodiment or implementation of the present disclosure. The phrase appearing in various places in the specification does not necessarily refer to the same embodiment or implementation. The particular feature, structure, material, or characteristic described may be properly combined in any one or more embodiments or implementations. In addition, when the embodiment or implementation is not mutually exclusive with other embodiments or implementations, it is expressly and implicitly understood by those skilled in the art that an embodiment described herein may be combined with other embodiments or implementations.

It will be evident to those skilled in the art that the corresponding processes of the above method implementations can be referred to for the working processes of the foregoing systems, apparatuses, and units, for purposes of convenience and simplicity and will not be repeated herein.

It will be appreciated that the systems, apparatuses, and methods disclosed in implementations herein may also be implemented in various other manners. For example, the above apparatus implementations are merely illustrative, e.g., the division of units (including sub-units) is only a division of logical functions, and there may exist other ways of division in practice, e.g., multiple units (including sub-units) or components may be combined or may be integrated into another system, or some features may be ignored or not included. In other respects, the coupling or direct coupling or communication connection as illustrated or discussed may be an indirect coupling or communication connection through some interface, device or unit, and may be electrical, mechanical, or otherwise.

Separated units (including sub-units) as illustrated may or may not be physically separated. Components or parts displayed as units (including sub-units) may or may not be physical units, and may reside at one location or may be distributed to multiple networked units. Some or all of the units (including sub-units) may be selectively adopted according to practical needs to achieve desired objectives of the disclosure.

Additionally, various functional units (including sub-units) described in implementations herein may be integrated into one processing unit or may be present as a number of physically separated units, and two or more units may be integrated into one.

If the integrated units are implemented as software functional units and sold or used as standalone products, they may be stored in a computer readable storage medium. Based on such an understanding, the essential technical solution, or the portion that contributes to the prior art, or all or part of the technical solution of the disclosure may be embodied as software products. Computer software products can be stored in a storage medium and may include multiple instructions that, when executed, can cause a computing device, e.g., a personal computer, a server, a second adapter, a network device, etc., to execute some or all operations of the methods as described in the various implementations. The above storage medium may include various kinds of media that can store program code, such as a USB flash disk, a mobile hard drive, a read-only memory (ROM), a random access memory (RAM), a magnetic disk, or an optical disk.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A device for detecting battery abnormality, comprising:
a voltage-sudden-change detecting circuit, configured to detect whether a sudden change in voltage has occurred to a battery and output a sudden-change signal when the sudden change in voltage has occurred to the battery;
a current detecting circuit, configured to detect a consumption current of the battery and output a small-current signal when the consumption current of the battery is smaller than a preset current threshold; and
an abnormality detecting unit, coupled with the voltage-sudden-change detecting circuit and the current detecting circuit, and configured to determine that the battery is abnormal upon reception of the sudden-change signal and the small-current signal at the same time, store state information on battery abnormality, and send the state information to a controller of a terminal device.

2. The device of claim 1, further comprising:
a communication interface coupled with the abnormality detecting unit, wherein the abnormality detecting unit is configured to communicate with the controller of the terminal device through the communication interface, to send the state information to the controller of the terminal device.

3. The device of claim 1, wherein the abnormality detecting unit is further configured to store identity information of the battery, and send the identity information of the battery to the controller of the terminal device upon sending of the state information, whereby the controller of the terminal device marks the battery as abnormal.

4. The device of claim 1, further comprising:
a temperature detecting unit, configured to detect temperature of the battery and send the temperature of the battery to the controller of the terminal device.

5. The device of claim 4, wherein the controller of the terminal device is configured to determine a fault grade of the battery according to the state information and the temperature of the battery when the battery is abnormal, and restrict corresponding functions of the terminal device according to the fault grade.

6. The device of claim 1, wherein the controller of the terminal device is further configured to control the terminal device to send alert information to indicate that the battery is abnormal, upon reception of the state information by the controller of the terminal device.

7. The device of claim 1, wherein the device is integrated into a battery protection chip or a battery fuel gauge.

8. The device of claim 1, wherein the voltage-sudden-change detecting circuit comprises:
- a resistor R1, having one end coupled to a positive electrode of the battery;
- a capacitor C1, having one end coupled with the other end of the resistor R1 at a connection node and having the other end grounded;
- a resistor R2 coupled in parallel with the capacitor C1;
- a resistor R3, having one end coupled to the positive electrode of the battery;
- a differential amplifier X1, having a negative input end coupled to the connection node and a positive input end coupled with the other end of the resistor R3; and
- a phase inverter U1, having an input end coupled with an output end of the differential amplifier X1 and an output end serving as an output end of the voltage-sudden-change detecting circuit.

9. The device of claim 1, wherein the voltage-sudden-change detecting circuit comprises:
- a resistor R4, having one end coupled to a positive electrode of the battery;
- a resistor R5, having one end coupled to the positive electrode of the battery;
- a capacitor C2, having one end coupled with the other end of the resistor R5 at a connection node and having the other end grounded;
- a differential amplifier X2, having:
    - a negative input end coupled with the other end of the resistor R4;
    - a positive input end coupled to the connection node; and
    - an output end serving as an output end of the voltage-sudden-change detecting circuit;
- a resistor R6, coupled between the negative input end of the differential amplifier X2 and the output end of the differential amplifier X2; and
- a resistor R7, coupled in parallel with the capacitor C2.

10. The device of claim 1, wherein the current detecting circuit comprises:
- a resistor R8, having one end coupled to a negative electrode of the battery and the other end coupled to a positive electrode of the battery via a system load;
- a resistor R9, having one end coupled with said one end of the resistor R8;
- a resistor R10, having one end coupled with the other end of the resistor R8;
- a differential amplifier X3, having a negative input end coupled with the other end of the resistor R9 and a positive input end coupled with the other end of the resistor R10;
- a resistor R11, coupled between the negative input end of the differential amplifier X3 and an output end of the differential amplifier X3;
- a comparator, having a positive input end coupled with the output end of the differential amplifier X3 and a negative input end coupled with a reference voltage supply end; and
- a phase inverter U2, having an input end coupled with an output end of the comparator and an output end serving as an output end of the current detecting circuit.

11. The device of claim 3, wherein the abnormality detecting unit comprises:
- an AND gate, having a first input end coupled with an output end of the voltage-sudden-change detecting circuit and a second input end coupled with an output end of the current detecting circuit, and configured to execute an "AND" operation on the sudden-change signal and the small-current signal to determine whether the battery is abnormal;
- a state memory, coupled with an output end of the AND gate and configured to store the state information when the battery is abnormal; and
- an identity information memory, configured to store identity information of the battery.

12. A battery system, comprising:
- a battery;
- a voltage-sudden-change detecting circuit, coupled to the battery, and configured to detect whether a sudden change in voltage has occurred to the battery and output a sudden-change signal when the sudden change in voltage has occurred to the battery;
- a current detecting circuit, coupled to the battery, and configured to detect a consumption current of the battery and output a small-current signal when the consumption current of the battery is smaller than a preset current threshold; and
- an abnormality detecting unit, coupled with the voltage-sudden-change detecting circuit and the current detecting circuit, and configured to determine that the battery is abnormal upon reception of the sudden-change signal and the small-current signal at the same time.

13. The battery system of claim 12, wherein the voltage-sudden-change detecting circuit comprises:
- a first resistor, having one end coupled to a positive electrode of the battery;
- a first capacitor, having one end coupled with the other end of the first resistor at a node and having the other end grounded;
- a second resistor coupled in parallel with the first capacitor;
- a third resistor, having one end coupled to the positive electrode of the battery;
- a first differential amplifier, having a negative input end coupled to the node and a positive input end coupled with the other end of the third resistor; and
- a differential amplifier, coupled with the other end of the first resistor and the other end of the first resistor.

14. The battery system of claim 13, wherein
the differential amplifier has a negative input end coupled with the other end of the first resistor at the node, a positive input end coupled with the other end of the third resistor, and an output end; and
the voltage-sudden-change detecting circuit further comprises:
- a phase inverter, having an input end coupled with the output end of the first differential amplifier and an output end serving as an output end of the voltage-sudden-change detecting circuit.

15. The battery system of claim 13, wherein
the differential amplifier has a negative input end coupled with the other end of the third resistor, a positive input end coupled with the other end of the first resistor at the node, and an output end serving as an output end of the voltage-sudden-change detecting circuit; and
the voltage-sudden-change detecting circuit further comprises:
- an addition resistor, coupled between the negative input end of the differential amplifier and the output end of the differential amplifier.

16. The battery system of claim 12, wherein the battery system further comprises a system load, and the current detecting circuit comprises:

a resistor R8, having one end coupled to a negative electrode of the battery and the other end coupled to a positive electrode of the battery via the system load;

a resistor R9, having one end coupled with said one end of the resistor R8;

a resistor R10, having one end coupled with the other end of the resistor R8;

a differential amplifier X3, having a negative input end coupled with the other end of the resistor R9 and a positive input end coupled with the other end of the resistor R10;

a resistor R11, coupled between the negative input end of the differential amplifier X3 and an output end of the differential amplifier X3;

a comparator, having a positive input end coupled with the output end of the differential amplifier X3 and a negative input end coupled with a reference voltage supply end; and a phase inverter, having an input end coupled with an output end of the comparator and an output end serving as an output end of the current detecting circuit.

17. The battery system of claim 12, wherein the abnormality detecting unit comprises:

an AND gate, having a first input end coupled with an output end of the voltage-sudden-change detecting circuit and a second input end coupled with an output end of the current detecting circuit, and configured to execute an "AND" operation on the sudden-change signal and the small-current signal to determine whether the battery is abnormal.

18. The battery system of claim 12, wherein the abnormality detecting unit comprises:

at least one memory, configured to store identity information of the battery and state information indicating that the battery is abnormal.

19. A terminal device, comprising:

a battery;

a controller;

a voltage-sudden-change detecting circuit, coupled to the battery, and configured to detect whether a sudden change in voltage has occurred to the battery and output a sudden-change signal when the sudden change in voltage has occurred to the battery;

a current detecting circuit, coupled to the battery, and configured to detect a consumption current of the battery and output a small-current signal when the consumption current of the battery is smaller than a preset current threshold; and an abnormality detecting unit, coupled with the voltage-sudden-change detecting circuit and the current detecting circuit, and configured to determine that the battery is abnormal upon reception of the sudden-change signal and the small-current signal at the same time, and send identity information of the battery and state information indicating battery abnormality to the controller, the controller being configured to mark the battery as abnormal according to the identity information and the state information.

20. The terminal device of claim 19, further comprising:

a temperature detecting unit, configured to detect temperature of the battery and send the temperature of the battery to the controller, the controller being further configured to:

determine a fault grade of the battery according to the state information and the temperature of the battery when the battery is abnormal, and restrict corresponding functions of the terminal device according to the fault grade.

* * * * *